United States Patent
Budach et al.

(10) Patent No.: US 11,170,970 B2
(45) Date of Patent: Nov. 9, 2021

(54) METHODS AND DEVICES FOR EXAMINING AN ELECTRICALLY CHARGED SPECIMEN SURFACE

(71) Applicant: Carl Zeiss SMT GmbH, Oberkochen (DE)

(72) Inventors: Michael Budach, Hanau (DE); Michael Schnell, Rechberghausen (DE); Bernd Schindler, Aalen (DE); Markus Boese, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 134 days.

(21) Appl. No.: 16/106,083

(22) Filed: Aug. 21, 2018

(65) Prior Publication Data

US 2019/0035601 A1  Jan. 31, 2019

Related U.S. Application Data

(62) Division of application No. 15/253,795, filed on Aug. 31, 2016, now Pat. No. 10,068,747.

(30) Foreign Application Priority Data

Sep. 1, 2015 (DE) .......................... 102015216673.2

(51) Int. Cl.
*H01J 37/28* (2006.01)
*H01J 37/02* (2006.01)
(Continued)

(52) U.S. Cl.
CPC .............. *H01J 37/28* (2013.01); *G01Q 30/02* (2013.01); *H01J 37/026* (2013.01); *H01J 37/04* (2013.01);
(Continued)

(58) Field of Classification Search
CPC ........ H01J 37/28; H01J 37/026; H01J 37/222; H01J 37/04; H01J 37/32009;
(Continued)

(56) References Cited

U.S. PATENT DOCUMENTS 5,159,196 A   10/1992  Kolbenschlag
5,736,863 A    4/1998  Liu
(Continued)

FOREIGN PATENT DOCUMENTS

DE     195 32 838      3/1997
DE     112012002811    7/2014
(Continued)

OTHER PUBLICATIONS

German Office Action for German Application No. 10 2015 216 673.2 dated Jun. 8, 2016 (6 pages).
(Continued)

*Primary Examiner* — Kiet T Nguyen
(74) *Attorney, Agent, or Firm* — Fish & Richardson P.C.

(57) ABSTRACT

A method for examining a specimen surface with a probe of a scanning probe microscope, the specimen surface having an electrical potential distribution. The method includes (a) determining the electrical potential distribution of at least one first partial region of the specimen surface; and (b) modifying the electrical potential distribution in the at least one first partial region of the specimen surface and/or modifying an electrical potential of the probe of the scanning probe microscope before scanning at least one second partial region of the specimen surface.

19 Claims, 12 Drawing Sheets

(51) Int. Cl.
   *H01J 37/22* (2006.01)
   *G01Q 30/02* (2010.01)
   *H01J 37/32* (2006.01)
   *H01J 37/04* (2006.01)
   *H01J 37/36* (2006.01)

(52) U.S. Cl.
   CPC ...... *H01J 37/222* (2013.01); *H01J 37/32009* (2013.01); *H01J 37/32935* (2013.01); *H01J 37/36* (2013.01); *H01J 2237/004* (2013.01); *H01J 2237/0041* (2013.01); *H01J 2237/0048* (2013.01); *H01J 2237/1538* (2013.01); *H01J 2237/2818* (2013.01); *H01J 2237/3174* (2013.01)

(58) Field of Classification Search
   CPC .................. H01J 37/32935; H01J 37/36; H01J 2237/004; H01J 2237/2818; H01J 2237/3174; H01J 2237/0041; H01J 2237/0048; H01J 2237/1538; G01Q 30/02; G01Q 10/065; G01R 19/16576; G01R 29/14
   USPC ........................................ 250/310, 306, 307
   See application file for complete search history.

(56) References Cited

U.S. PATENT DOCUMENTS

| | | | |
|---|---|---|---|
| 6,303,932 | B1 | 10/2001 | Hamamura et al. |
| 6,507,474 | B1 | 1/2003 | Singh et al. |
| 6,720,556 | B2 | 4/2004 | Cohen et al. |
| 6,946,656 | B2 | 9/2005 | Ezumi et al. |
| 7,745,782 | B2 | 6/2010 | Ishijima et al. |
| 7,770,474 | B2 | 8/2010 | Yasutake et al. |
| 2002/0070340 | A1 | 6/2002 | Veneklasen et al. |
| 2004/0051040 | A1 | 3/2004 | Nasu et al. |
| 2004/0211899 | A1 | 10/2004 | Ezumi et al. |
| 2008/0203298 | A1 | 8/2008 | Ishijima et al. |
| 2008/0223122 | A1 | 9/2008 | Watanabe et al. |
| 2011/0057101 | A1 | 3/2011 | Komuro et al. |
| 2011/0068265 | A1 | 3/2011 | Arai et al. |
| 2014/0027635 | A1* | 1/2014 | Matsui ................ H01J 37/026 250/311 |
| 2014/0175279 | A1 | 6/2014 | Agemura |
| 2014/0366228 | A1 | 12/2014 | Williams et al. |
| 2016/0245843 | A1 | 8/2016 | Shioda et al. |
| 2017/0062180 | A1 | 3/2017 | Budach et al. |

FOREIGN PATENT DOCUMENTS

| | | |
|---|---|---|
| JP | H8-195181 | 7/1996 |
| JP | 2005-055388 | 3/2005 |
| JP | 2008-111734 | 5/2008 |
| JP | 2009-14343 | 1/2009 |
| TW | 2015-04630 | 2/2015 |

OTHER PUBLICATIONS

Japanese Office Action for Japanese Application No. JP 2016-170510 dated Aug. 23, 2017 (5 pages).

Korean Notice of Allowance for Korean Application No. 10-2016-0111887 dated Apr. 19, 2018 (4 pages).

Korean Office Action for Korean Application No. 10-2016-0111887 dated Dec. 13, 2017 (6 pages).

Notice of Examination Opinion from the Taiwan Patent Office for Taiwan Patent Application No. 105127857 dated Nov. 24, 2017 (7 pages including English translation).

Kazemian, P. et al., "Quantitative secondary electron energy filtering in a scanning electron microscope and its applications", *Ultramicroscopy*, vol. 107, pp. 140-150 (2007).

Khursheed, Anjam, "Secondary Electron Spectrometers", *Scanning Electron Microscope Optics and Spectrometers*, pp. 223, 254, 255, 258, 259 (2011).

Lee, Jeng-Han et al., "Surface Potential and Electric Field Mapping of p-well/n-well Junction by Secondary Electron Potential Contrast and *in-situ* Nanoprobe biasing", *Physical and Failure Analysis of Integrated Circuits (IPFA)*, 19$^{th}$ IEEE International Symposium on the, Singapore, p. 1-3 (2012).

Okai, Nobuhiro et al., "Study on Image Drive Induced by Charging during Observation by Scanning Electron Microscope", *Japanese Journal of Applied Physics*, vol. 51, pp. 06FB11-1-06FB11-7 (2012).

Okamoto, Kenji et al., "The elimination of the "artifact" in the electrostatic force measurement using a novel noncontact atomic force microscope/electrostatic force microscope", *Applied Surface Science*, vol. 188, pp. 381-385 (2002).

Reimer, L., "Principle of the Scanning Electron Microscope", *Scanning Electron Microscope*, pp. 1-5 (1998).

Satyalakshmi et al., "Charge induced pattern distortion in low energy electron beam lithography", J. Vac. Sci. Technol. vol. 18(6), Nov./Dec. 2000, pp. 3122-3125.

Thomas et al., "Electron-beam-induced potentials in semiconductors: calculation and measurement with an SEM/SPM hybrid system", *Journal of Physics D: Applied Physics*, vol. 37, pp. 2785-2794 (2004).

\* cited by examiner (a)

(b)

METHODS AND DEVICES FOR EXAMINING AN ELECTRICALLY CHARGED SPECIMEN SURFACE

CROSS-REFERENCE TO RELATED APPLICATION

This application is a divisional of and claims priority to U.S. application Ser. No. 15/253,795, filed on Aug. 31, 2016, which claims priority to German patent application 10 2015 216 673.2, filed on Sep. 1, 2015. The contents of the priority documents are incorporated herein by reference in their entirety.

TECHNICAL FIELD

The present invention relates to methods and devices for examining an electrically charged specimen surface.

BACKGROUND

Advances in nanotechnology make it possible to produce components with increasingly smaller structural elements. To show and process the nanostructures, tools that can scan the structures in multiple dimensions are required, so that images can be generated from the measurement data of these tools. Furthermore, to produce microstructured components, photomasks are required, the pattern elements of which can project the tiny structural elements of the components or nanostructures into the photoresist applied to a wafer.

A powerful tool for locally analyzing a specimen is a scanning electron microscope (SEM), the electron beam of which can be focused very finely, so that the beam diameter at the focal point is in the single-digit nanometer range. This measuring instrument scans the electron beam over the surface of a specimen. Among the effects of the interaction of the electrons with the specimen are that secondary electrons (SE) and back-scattered electrons (BSE) are generated.

However, the resolution of a scanning electron microscope and the quality of the images generated falls sharply if the specimen to be examined has a significant surface charge. FIG. 1 illustrates this problem. If a specimen has a positive electrical charge, an electron beam produces too large an image of a structural element arranged on the specimen surface. If, on the other hand, the surface of the specimen is negatively charged, the SEM forms too small an image of the structural element. For example when examining the critical dimension (CD) and/or positioning errors of structural elements of a photomask, of a developed photoresist or of a component on a wafer, this can lead to great uncertainty in determining the process yield.

Scanning probe microscopes (SPM) are likewise powerful analytical tools in nanotechnology. SPMs scan a specimen or its surface with a probe tip and thus produce a realistic topography of the specimen surface. Depending on the kind of interaction between the measuring tip and the specimen surface, a distinction is made between different types of SPM, for example scanning tunnelling microscopes (STMs) or scanning force microscopes (SFMs), which are also known as atomic force microscopes (AFMs). For example, scanning force microscopes scan a specimen surface by their probe tip or measuring tip being passed over the surface of the probe at a very small distance (i.e. in the range of a few nanometers) (non-contact mode) or else while touching the surface (contact mode).

So if there is an electrical charge distribution on a specimen or its surface, i.e. the specimen surface and the measuring tip of the AFM are at different electrical potentials, compensating currents may flow when there is contact between the measuring tip and the specimen surface or when there is a small distance from the specimen, or electrical flashovers may occur, and these may lead to damage or destruction of a fine measuring tip and/or a sensitive specimen. FIG. 2 illustrates this matter.

Electrical charging of an insulating and/or semiconducting specimen may be caused by irradiation of the specimen with an electron beam or generally with a charged particle beam. Furthermore, even handling of a specimen may lead to an electrostatic charge of its surface. If the specimen is a wafer to be processed, coating processes and/or etching processes may also result in an electrical charging of the specimen.

Consequently, electrical charging of the specimen surface is extremely undesirable for examinations that are performed using a scanning electron microscope or a scanning probe microscope.

In the case of specimens that have an electrically conductive surface, electrical charging can be avoided by earthing the specimen. In the case of electrically insulating or semiconducting specimens, surface charges can be prevented by vapor-depositing a thin conductive layer onto the surface of a specimen to be examined. However, the latter is not possible for many applications, in particular whenever the aforementioned analytical tools are used for example in the production of microstructured semiconductor components or in the production of photomasks.

The authors K. M. Satyalakshmi et al. report in the article "Charge induced pattern distortion in low energy electron beam lithography", J. Vac. Sci. Technol. vol. 18(6), November/December 2000, pp. 3122-3125 on investigations into determining the deflection of an electron beam as a function of charge distributions on a specimen surface that are produced in the vicinity of the point of incidence.

To prevent an electrical charge from impairing the measurement of structural elements of semiconductor components during their production, U.S. Pat. No. 5,736,863 proposes the application of earthed test structures in the intermediate spaces between individual chips.

US 2002/0070340 A1 describes the use of two electron beams of differing energy, the lower-energy beam, which has an electron generation rate of <1, compensating for the electron generation rate of the higher-energy beam, which is >1, so that no surface charges occur.

To compensate for surface charges, U.S. Pat. No. 6,507,474 B1 proposes measuring the charging of the surface with a charge sensor and compensating for it with the aid of an ionizer.

US 2004/0051040 A1 discloses a scanning electron microscope that controls the irradiating intensity of the electron beam in such a way that a change in the volume of a photoresist as a result of the electron irradiation remains as small as possible.

The aforementioned documents are primarily concerned with the avoidance or reduction of electrical charges.

US 2004/0211899 A1 describes the use of one or more electrometers to determine the electrical charging of a wafer surface.

In some examples, electrometers may have the disadvantage that they cannot measure an electrical charge distribution locally but only over a large area, i.e. in the range of square millimeters to square centimeters.

SUMMARY

In some implementations, the present invention provides methods and devices for examining a specimen surface with a charged particle beam and/or a scanning probe microscope when the surface thereof has an electrical potential distribution.

According to an exemplary embodiment of the present invention, a method for examining a specimen surface that has an electrical potential distribution with a probe of a scanning probe microscope comprises the steps of: (a) determining the electrical potential distribution of at least one first partial region of the specimen surface; and (b) modifying the electrical potential distribution in the at least one first partial region of the specimen surface and/or modifying an electrical potential of the probe of the scanning probe microscope before scanning at least one second partial region of the specimen surface.

Knowing the electrical potential distribution in the region of the specimen surface that is to be scanned by a probe or measuring tip of a scanning probe microscope can prevent a fine probe and/or a sensitive specimen from being subjected to damage or even destruction. Furthermore, excessive wear of a probe of an SPM due to great compensating currents can be avoided. In addition, eliminating or at least reducing the potential difference between the probe and the specimen allows an erroneous interpretation of the scanning or measurement data that is recorded by the probe to be prevented. A reduction of this potential difference can be brought about by measures that have an effect on the local potential distribution in the scanning range of the scanning probe microscope, that have an effect on the potential of the measuring tip or that have an effect both on the local electrical potential distribution and on the potential of the measuring tip.

According to another aspect, step (b) is performed if an absolute value of the electrical potential distribution in the at least one first partial region of the specimen surface exceeds a first threshold.

If the potential difference between a measuring tip of a scanning probe microscope and the electrical potential distribution of the probe surface only has a low numerical value, for example less than 1 volt, it may be advantageous to dispense with a measure for reducing this small potential difference. As a result, the measuring expenditure can be reduced.

A further aspect also comprises the step of: scanning the at least one second partial region of the specimen surface with the probe of the scanning probe microscope if an absolute value of the electrical potential distribution in the at least one first partial region of the specimen surface is less than or equal to the first threshold.

If the determination of the local potential distribution around the part of the specimen surface to be scanned shows that the absolute value of the measured local potential distribution does not exceed a first threshold value, the part of the specimen surface can be scanned without risk to the probe and the specimen. The first threshold value may be externally preset and may depend on the measuring tip used and the material and/or the topography of the surface of the specimen.

According to another aspect, the modification of the electrical potential of the probe of the scanning probe microscope comprises applying to the probe a voltage that corresponds substantially to the determined electrical potential distribution in the at least one second partial region of the specimen surface.

By bringing the measuring tip of the scanning probe microscope to the same electrical potential as the local specimen surface to be scanned, the scanning or measurement data do not have any systematic measurement errors and can be analyzed in a simple way.

The expression "substantially" means here and at other points of the description the specification of a measured variable within the limits of a measurement error that occurs when using measuring instruments according to the prior art.

In yet another aspect, the modification of the electrical potential distribution in the at least one first partial region of the specimen surface comprises irradiating the specimen surface with a charged particle beam.

An existing electrical charge of a specimen surface can be compensated by applying to the first partial region of the specimen surface charge carriers that have an opposed electrical charge.

According to another aspect, the modification of the electrical potential distribution comprises applying a plasma discharge to at least the first partial region of the specimen surface.

Plasmas contain free charge carriers with positive and negative signs. Both positive and negative charges of a specimen can be largely discharged with plasmas by appropriately conducting the process.

An advantageous aspect also comprises the step of: fixing an irradiation dose of the charged particle beam in dependence on the determined electrical potential distribution of the at least one first partial region of the specimen surface and/or fixing a time period of the plasma discharge in dependence on the determined electrical potential distribution of the at least one first partial region of the specimen surface.

It is advantageous to adapt the local irradiation dose, or the time period during which a plasma burns, to the local potential distribution in order to discharge the partial region of the specimen surface as much as possible and/or on the other hand avoid damage to the specimen.

Another aspect also comprises the step of: modifying the electrical potential distribution in the at least one first partial region of the specimen surface if the absolute amount of the determined electrical potential distribution of the at least one first partial region exceeds a second threshold, which is greater than the first threshold.

In terms of the absolute value, a local potential distribution may have such a great value, for example in the range of kilovolts, that it is difficult and involves great expenditure, or even is impossible, to bring the measuring tip of the scanning probe microscope to this potential. In this case it is advantageous to reduce the local potential distribution on the specimen surface to the extent that the potential of the measuring tip of the SPM can be adapted to it.

Yet another aspect also comprises the step of: (a) again determining the electrical potential distribution at least in the first partial region of the specimen surface; and (b) scanning the at least one second partial region of the specimen surface with the probe of the scanning probe microscope if the absolute value of the electrical potential distribution in the at least one first partial region is less than or equal to the first threshold; or (c) again modifying the electrical potential distribution in the at least one second partial region of the specimen surface and/or modifying the electrical potential of the probe before the scanning of the at least one second partial region if the absolute value of the electrical potential distribution in the at least one first partial region of the specimen surface exceeds the first threshold and is less than the second threshold.

In a first process step, a very great potential distribution in terms of the absolute value can be brought to a level such that the probe of an SPM can be used for scanning in the intended region with or without potential adaptation. According to the first process step, it can be advantageously checked whether the possibly remaining potential distribution in the scanning range of the probe of the SPM is less than a preset threshold value.

According to an advantageous aspect, the first threshold lies in an electrical voltage interval of, e.g., 0.1 volt-20 volts, preferably of 0.2 volt-15 volts, more preferably of 0.5 volt-10 volts, and most preferably of 1 volt-5 volts. According to another aspect, the second threshold lies in an electrical voltage interval of, e.g., 25 volts-50 000 volts, preferably of 30 volts-20 000 volts, more preferably of 40 V-10 000 V, and most preferably of 50 volts-5000 V.

As already stated above, the second partial region of the specimen surface may be safely scanned with the probe of the scanning probe microscope if, in terms of the absolute value, the electrical potential distribution in the first partial region of the specimen surface is less than or equal to the first threshold. If the potential distribution in the first partial region in terms of the absolute value is greater than the first threshold but in terms of the absolute value is less than the second threshold, the potential of the probe of the scanning probe microscope can be adapted to the potential distribution of the specimen surface. If, however, the absolute value of the potential distribution exceeds the second threshold, it is preferred to reduce the potential distribution of the specimen surface in terms of the absolute value.

According to a further aspect, the at least one first partial region of the specimen surface comprises the at least one second partial region of the specimen surface.

According to an advantageous aspect, the at least one second partial region of the specimen surface has a surface area of, e.g., ≤400 µm², preferably ≤200 µm², more preferably ≤100 µm², and most preferably 50 µm². According to a further aspect, the at least one first partial region of the specimen surface is greater than the at least one second partial region of the specimen surface by a factor of, e.g., 1.2, preferably a factor of 1.5, more preferably a factor of 2, and most preferably a factor of 5.

According to another aspect, the scanning probe microscope comprises a scanning force microscope.

According to a second exemplary embodiment of the present invention, the problem addressed by the present application is solved by a method for examining a specimen surface that has an electrical potential distribution with a charged particle beam of a scanning particle microscope. The method comprises the steps of: (a) determining the electrical potential distribution of at least one first partial region of the specimen surface; (b) correcting at least one setting of the scanning particle microscope on the basis of the potential distribution determined in step (a) for processing at least one second partial region of the specimen surface with the charged particle beam; and/or (c) scanning at least one first partial region of the specimen surface with the charged particle beam of the scanning particle microscope; and (d) correcting by use of the potential distribution determined in step (a) an image of the scanning particle microscope generated from the scanning data of the at least one second partial region.

On the basis of the known potential distribution, an image of a scanning particle microscope can be subsequently processed in a post-processing process and the artefacts caused by the surface charge can be at least partially corrected. With knowledge of the potential distribution of the specimen surface, it is also possible to choose one or more settings of a scanning particle microscope such that, in spite of the surface charges that are present, precisely the intended partial region is processed in a processing process of a partial region of the specimen surface and the particle beam has the intended parameters when it is incident on the partial region.

An advantageous aspect also comprises the step of: determining the electrical potential distribution from the scanning data produced in step (c).

It is preferred to ascertain from a data record that has been obtained when scanning a partial region of the specimen surface both the potential distribution prevailing in this potential region and an image of the scanned partial region of the specimen surface. The image can then be subsequently processed on the basis of the ascertained electrical potential distribution. This avoids the problem that a first scanning for ascertaining the data present on the specimen changes the electrical potential distribution during the subsequent scanning of the partial region for recording an image of the scanning particle microscope, so that the post-processing of the image is not based on the actual distribution of the surface charges prevailing during the recording of the image.

According to a further aspect, the at least one setting of the scanning probe microscope comprises: altering a magnification, altering a focus, altering a stigmator, altering an acceleration voltage, altering a beam displacement, adjusting a position of the particle source of the scanning particle microscope and/or altering a stop. Furthermore, the settings of particle detectors attached to the scanning particle microscope may be modified, in particular an energy scale in the case of energy-selective and/or energy-sensitive detectors.

In addition, according to a further aspect, the processing of the at least one second partial region of the specimen surface comprises providing at least one etching gas and/or at least one precursor gas for depositing material in the at least one second partial region of the specimen surface.

A second embodiment of the method defined above may be used to remove excess material in a second partial region with the aid of a particle-beam-induced etching process and/or to deposit missing material in the second partial region by a particle-beam-induced deposition process. The fact that allowance for the effects of a charging of the particle surface can be at least partly made in these processes means that these processes can be performed in a more precisely directed manner, and consequently can be improved.

Yet another aspect also comprises the step of: correcting the image of the scanning particle microscope pixel by pixel in step d. and/or correcting the at least one setting of the scanning particle microscope pixel by pixel in step b.

The determination of the electrical potential distribution may take place on the basis of individual pixels of an image of the scanning particle microscope. This makes it possible to correct the pixels individually in image post-processing. In addition, the setting of a scanning particle microscope in a processing process of the specimen can be controlled pixel-precisely.

According to an advantageous aspect, the correction of an image of the scanning particle microscope generated from the scanning data in step (d) comprises correcting a critical dimension and/or a positioning error of a structural element of a photomask, a structural element of a photoresist arranged on a wafer and/or a structural element of a component on a wafer.

According to yet another aspect, the scanning particle microscope comprises a scanning electron microscope.

According to a further aspect, the determination of the electrical potential distribution of at least the first partial region of the specimen surface comprises analyzing an energy distribution of secondary electrons by use of a spectrometer of the at least one first partial region of the specimen surface, the secondary electrons being generated during the scanning of the at least one first partial region of the specimen surface with a particle beam of a scanning particle microscope.

The fact that the secondary electrons generated are analyzed both with regard to the number and with respect to their energy distribution means that, along with the material composition and the specimen topography, the electrical potential distribution of the charged surface can be additionally investigated.

In another advantageous aspect, the determination of the electrical potential distribution of the at least one first partial region of the specimen surface comprises determining a displacement of the energy distribution of the secondary electrons.

According to an advantageous aspect, the determination of the displacement of the energy distribution of the secondary electrons takes place with respect to a specimen surface that has substantially no electrical potential.

In this application, the earthing potential represents the reference point for the determination of the electrical potential distribution caused by surface discharges on the specimen.

In a beneficial aspect, the determination of the displacement of the distribution of the secondary electrons comprises applying an electrical field over the at least one first partial region of the specimen surface. According to yet another aspect, the field lines of the electrical field point away from the specimen surface.

With positive charging of a partial region of a specimen surface, only some of the secondary electrons generated can leave the specimen surface in this region on account of the attractive effect of the surface charges. For this reason, in this case only some of the secondary electrons generated are available for the analysis of the specimen. By applying an electrical field that compensates for the effect of the surface charges, it is possible that substantially the entire spectrum of the secondary electrons generated can be passed on for subsequent analysis.

According to an advantageous aspect, the determination of the electrical potential distribution of the at least one first partial region of the specimen surface comprises determining a maximum of the energy distribution of back-scattered electrons in the at least one first partial region of the specimen surface, the back-scattered electrons being generated during the scanning of the at least one first partial region of the specimen surface.

The fact that the peak of the back-scattered electrons is also ascertained along with the displacement of the energy spectrum of the secondary electrons means that it is possible for example to eliminate zero-point fluctuations of a spectrometer or uncertainties that are attributable to the extraction field.

According to an advantageous aspect, a device for examining a specimen surface that has an electrical potential distribution with a probe of a scanning probe microscope has: (a) means for determining the electrical potential distribution of at least one first partial region of the specimen surface; and (b) means for modifying the electrical potential distribution of the at least one first partial region of the specimen surface and/or means for modifying an electrical potential of the probe of the scanning probe microscope before scanning at least one second partial region of the specimen surface if an absolute value of the electrical potential distribution in the at least one first partial region of the specimen surface exceeds a first threshold.

According to yet another aspect, the device is designed to perform the method steps according to one of the above aspects.

According to an advantageous aspect, a device for examining a specimen surface that has an electrical potential distribution with a charged particle beam of a scanning particle microscope comprises: (a) means for determining the electrical potential distribution of at least one first partial region of the specimen surface; (b) means for correcting at least one setting of the scanning particle microscope on the basis of the determined potential distribution for processing at least one second partial region of the specimen surface with the charged particle beam; and/or (c) means for scanning the at least one first partial region of the specimen surface with the charged particle beam of the scanning particle microscope; and (d) means for correcting by use of the determined potential distribution an image of the scanning particle microscope generated from the scanning data of the at least one second partial region.

According to yet another aspect, the device is designed to perform the method steps according to one of the aspects specified above.

Finally, in yet another advantageous aspect, the device comprises at least one spectrometer.

DESCRIPTION OF DRAWINGS

The following detailed description describes a number of exemplary embodiments of the invention, with reference being made to the drawings.

DETAILED DESCRIPTION

Embodiments of two methods according to the invention for examining a charged specimen surface are explained in more detail below by the example of a charged electron beam and a probe of an atomic force microscope (AFM) together with the associated devices for performing these methods. However, the methods according to the invention are not restricted to the examples discussed below. Rather, they can be used for any charged particle beam and any scanning probe microscope. In addition, the application of methods according to the invention is not restricted to the specimens mentioned below. Rather, the charged particle beam and the probe may be used for examining any electrically insulating and/or semiconducting specimens.

Figure 1:
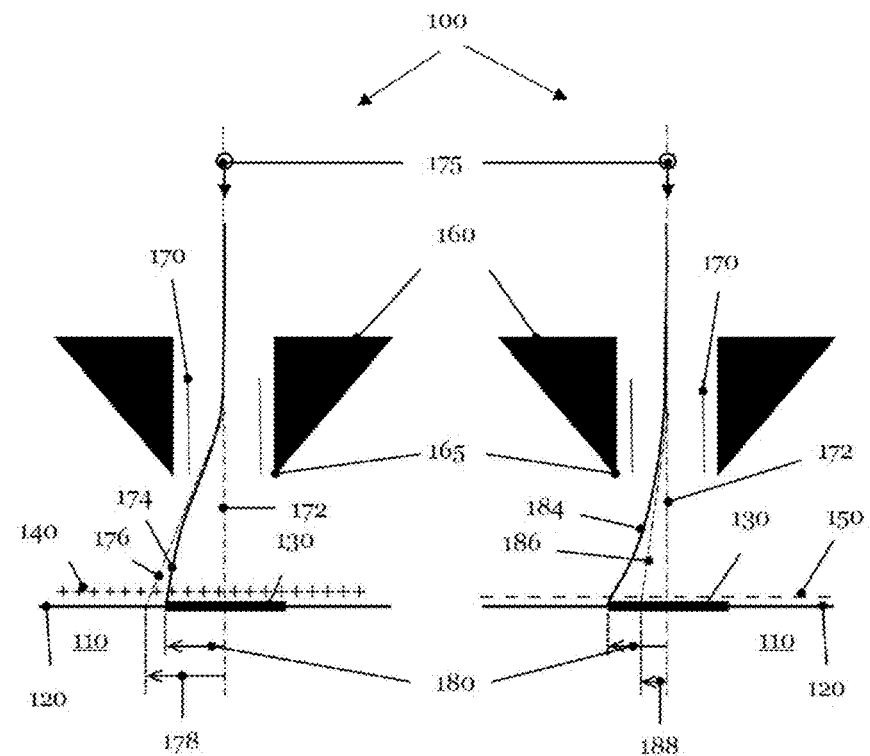
FIG. 1 illustrates an aspect of the problem when examining a charged surface with an electron beam.

The diagram 100 of FIG. 1 shows schematic sections through a charged specimen 110 and an output 165 of a scanning electron microscope 160. The specimen 110 may for example be an electrically insulating substrate of a photomask. The specimen 110 may be a wafer to be processed or may be realized by a photoresist on a wafer. The specimen 110 has on its surface 120 a distribution of surface charges (e.g., electrostatic charge) that cause an electrical potential distribution. In some of the examples below, the electrical potential distribution may refer to, but not limited to, the electrical potential distribution of an electrostatic charge. On the left part of the image, the specimen surface 120 has a positive charge 140. In the right part of the image, the specimen surface 120 shows an excess of negative charges 150. The reference signs 140 and 150 are used to denote both a distribution of surface charges on a specimen surface 120 and the electrical potential distributions caused by the charged surfaces.

An electrical charge 140, 150 of a specimen surface 120 may be caused by a charged particle beam, for example the electron beam 175 of a scanning electron microscope (SEM). An electrical potential distribution 140, 150 of a specimen surface 120 may be produced by a processing process, for example when processing the specimen 110 with an ion beam, in the case of a plasma process on a wafer and/or a processing process on a photoresist arranged on a wafer. Furthermore, an electrical charge of a specimen 110 may be caused for example by the handling of the specimen 110.

In the portion of the specimen 110 that is represented in the diagram 100 of FIG. 1, the distribution of the surface charges 140, 150 has a uniform density. However, this does not represent a precondition for the application of the methods discussed here. Rather, the methods and devices that are presented in this application can also deal with changes in charge density that vary within small lateral distances. This issue is explained below in the context of the discussion of FIG. 8.

In the example of FIG. 1, a deflection system 165 deflects the electron beam 175 and scans it over the specimen surface 120 to determine the dimensions of the structural element 130. For example, a structural element 130 may be an element of an absorber structure of a photolithographic mask. Similarly, a structural element 130 may be an element that a photomask has projected into a photoresist. In another example, the structural element 130 is an element of a chip of a wafer.

As presented in the left part of the image of diagram 100, an electron beam 175 scanning the structural element 130 is deflected by the attractive effect of a positive charge 140 of the specimen surface 120 in the vicinity of the specimen surface in the direction of the optical axis of 172 and follows the trajectory 174. Without the electrical potential distribution 140, the electron beam 175 would follow the path 176. In an SEM image generated by the electron beam 175, the scanned dimension 178 appears larger than the actual dimension 180 of the structural element 130.

By analogy, the right part of the image of FIG. 1 illustrates the repellent effect of a negatively charged 150 specimen surface 120 on the path movement 184 of the electrons 170 of an electron beam. Due to the additional deflection of the electron beam 175 in the vicinity of the specimen surface 120 as a consequence of the charge distribution 150, the actual dimension 180 of the structural element 130 in an SEM image generated from the scanning data appears to have a smaller dimension 188.

If the state of charge, i.e. the local electrical potential distribution 140, 150, of the specimen surface 120 around a region to be scanned is successfully determined, the erroneous interpretation of the scanning or measurement data of the electron beam 175 of the SEM 160 can be corrected. Moreover, when processing for example the structural element 130 by an electron beam 175 and one or more process gases, it can be ensured by suitable settings of the parameters of the SEM 160 that the structural element 130 is in fact processed in an intended region.

Figure 2:
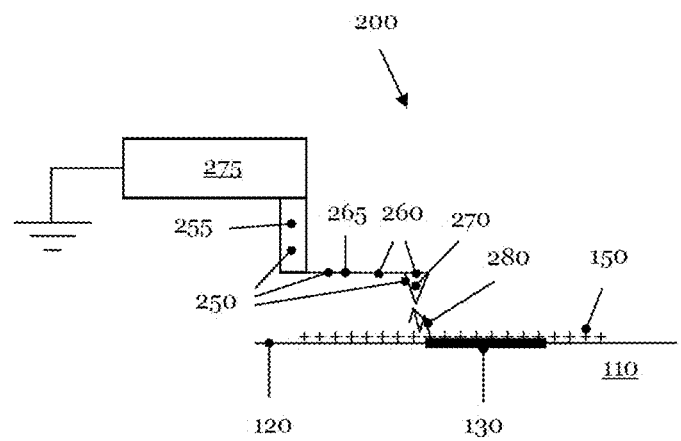
FIG. 2 symbolizes an aspect of the matter when scanning a charged specimen surface with a probe of a scanning probe microscope.

The diagram 200 of FIG. 2 illustrates the problem when scanning an atomic force microscope 250 over a charged 150 specimen surface 120. The portion of the specimen 110 of the diagram 200 is identical to the portion of the left part of the image of diagram 100. The AFM 250 comprises a piezo actuator 255, with the aid of which the probe 260 of the AFM 250 can be scanned over the surface 120 of the specimen 110. The probe 260 comprises a movable lever arm 265, which is referred to hereinafter as the cantilever 265. Attached to the free end of the cantilever 265 is the measuring tip 270. The cantilever 265 and the measuring tip 270 may be configured in one piece or as two connected components. At the end of the piezo actuator 255 that is opposite from the cantilever 265, the AFM 250 is fastened to a mounting 275. The mounting 275 is normally earthed. Consequently, the measuring tip 270 of the AFM 250 is typically at earth potential. When the earthed measuring tip 270 is brought closer to a charged 150 specimen surface 120, electrical flashovers 280 may occur between the charged 150 specimen surface 120 and the measuring tip 270. The distance of the measuring tip 270 of the AFM 250 in the non-contact operating mode may go into the single-digit nanometer range. The diameter of a fine measuring tip 270 may likewise lie in this range. For this reason, even small potential differences or voltages of a few volts between the measuring tip 270 and the specimen surface 120 are sufficient to produce great peak electrical field strengths, which may lead to uncontrolled flashovers 280.

Uncontrollable voltage flashovers 280 may damage or destroy fine measuring tips 270. In the case of measuring tips 270 that have a greater radius of curvature at their free end, voltage flashovers 280 lead to rapid wearing of the measuring tip 270. What is more, the interpretation of scanning or measurement data is very difficult when uncontrolled voltage flashovers 280 occur. Finally, voltage flashovers 280 between the specimen surface 120 and the measuring tip 270 may damage a sensitive specimen surface 120, and as a result possibly destroy a specimen 110.

It is therefore important to know the electrical potential distribution 150 in the scanning region of an AFM 250, in order to be able to counteract the described problem by suitable countermeasures.

Figure 3:
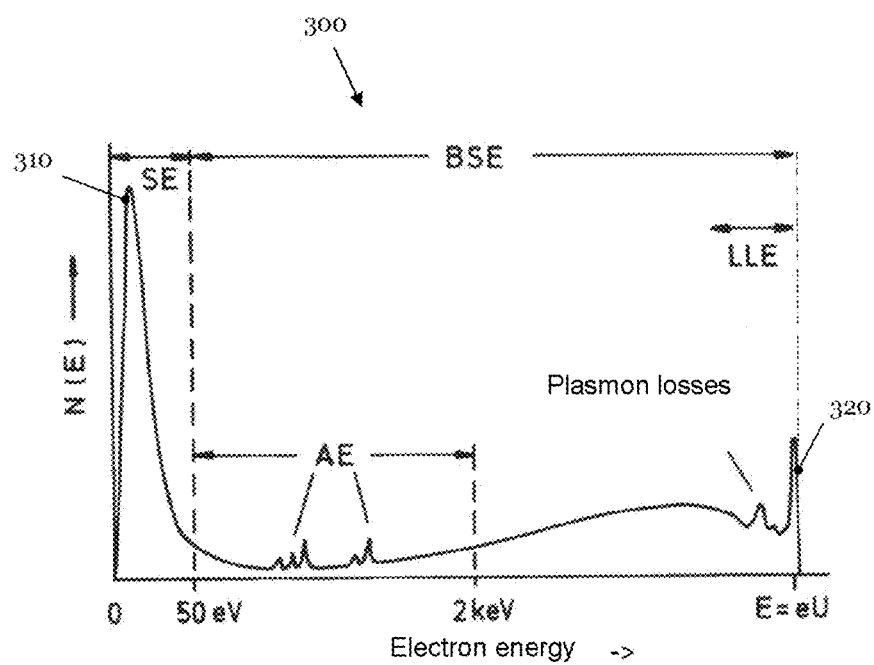
FIG. 3 presents a schematic energy spectrum of the electrons that an electron beam incident on a specimen generates.

During the irradiation of a specimen 110 with the electrons 175 of an electron beam, the electrons 175 interact with the specimen 110. The process of interaction of the incident electron beam 175 with the atoms of the specimen 110 generates electrons. Some of the electrons generated in the interaction process may leave the specimen surface 120 and are detected by one or more detectors and used for generating an SEM image of the specimen surface 120. The diagram 300 of FIG. 3 schematically shows the energy spectrum of the electrons generated by an electron beam 175. This figure can be taken from the book "Scanning Electron Microscopy" by L. Reimer. The energy spectrum of the electrons emitted by a specimen 120 is divided into two main groups. Low-energy electrons with a kinetic energy of up to 50 eV are known as secondary electrons (SE). All other generated electrons, the spectral energy distribution of which ranges from 50 eV substantially up to the kinetic energy of the electrons 175 of the incident electron beam (E=e·U), are referred to as back-scattered electrons (BSE).

If the surface 120 of a specimen 110 has no surface charges, the energy spectrum of the secondary electrons shows a distinct material- and/or topography-specific peak 310 in the range of several volts. In the energy range of approximately 50 eV to approximately 2 keV, material-specific peaks may likewise occur in the spectrum of back-scattered electrons, caused by Auger electrons (AE). At the upper end of the energy spectrum of back-scattered electrons there is an elastic peak 320, which is caused by electrons that are reflected from the specimen surface 120 substantially with the kinetic energy of the incident electrons 175. Following on below this peak 320 is the so-called LLE (Low Loss Electron) range, which includes the back-scattered electrons, the energy of which is typically 10 eV to 100 eV lower than the kinetic energy of the incident electrons 175. The LLE range also comprises the range of plasma excitation (plasmon losses), so that in this spectral range relatively few back-scattered electrons leave the specimen surface 120.

Figure 4:
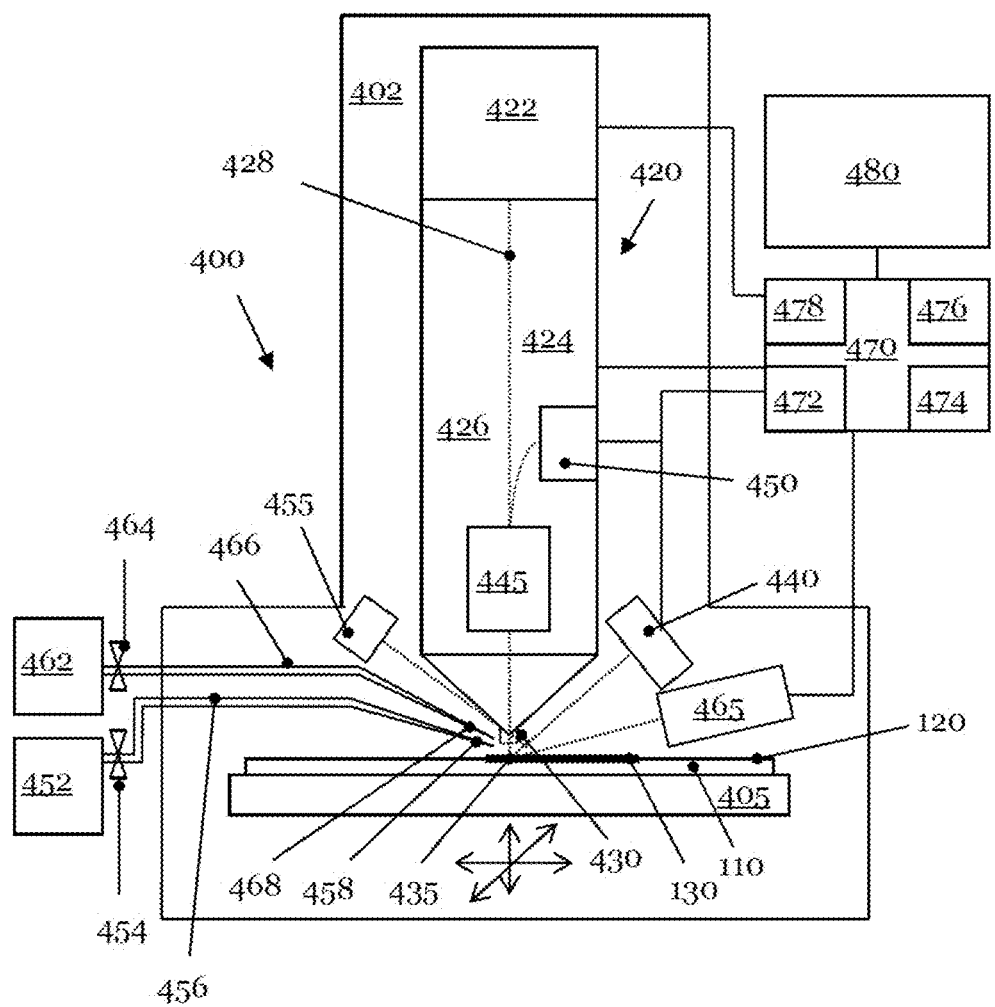
FIG. 4 presents a schematic section through a device for determining a local electrical potential distribution of a charged specimen surface, the device also being able to be used for generating an image of a portion of the charged specimen surface and for processing the charged specimen surface.

FIG. 4 schematically shows in section several components of a device 400 or a measuring device 400, which has a scanning particle microscope 420 in a vacuum chamber 402. In the example of FIG. 4, the scanning particle microscope 420 is a scanning electron microscope (SEM) 420. An electron beam as a particle beam has the advantage that it cannot substantially damage the specimen 110, or only to a slight extent. However, other charged particle beams are also possible, for instance an ion beam of an FIB (Focused Ion Beam) system (not represented in FIG. 4).

The SEM 420 comprises as components a particle gun 422 and a column 424, in which the electron optics or beam optics 426 is arranged. The electron gun 422 produces an electron beam 428 and the electron or beam optics 426 focuses the electron beam 428 and directs it at the output of the column 424 onto a specimen 110, which may be identical to the specimen 110 of FIGS. 1 and 2.

The specimen 110 is arranged on a specimen table 405. As symbolized in FIG. 4 by the arrows, the specimen table 405 can be moved in three spatial directions in relation to the electron beam 428 of the SEM 420.

At the lower end of the column 424, at which the electron beam 428 leaves the electron optics 426 arranged in the column 424, a grating 430 is fastened to the column 424 in the device 400 that is represented by way of example in FIG. 4. With the aid of this grating, the energy of the secondary electrons that can leave the specimen surface 120 can be set.

A spectrometer-detector combination 440 discriminates the secondary electrons generated by the electron beam 428 at the first measuring point 435 and/or electrons back-scattered by the specimen 110 on the basis of their energy and then converts them into an electrical measurement signal. The measurement signal is then passed on to an evaluation unit 476 of the computer system 470.

To save energy, the spectrometer-detector combination 140 may include a filter or a filter system in order to discriminate the electrons in the energy (not represented in FIG. 4). Several types of energy filters or spectrometers for electrons are known in the literature. Examples of this are retarding-field spectrometers, deflecting spectrometers, which use a magnetic field or an electrostatic field, for instance in the form of cylindrical mirror analyzers (CMAs) or cylindrical deflection analyzers (CDAs). Furthermore, multi-channel spectrometers, which can simultaneously determine substantially the entire energy spectrum of the secondary electrons and/or of the back-scattered electrons, may be used.

Like the spectrometer-detector combination 440—energy-resolving spectrometers may be arranged outside the column 424 of the SEM 420. However, it is also possible to arrange a spectrometer and the associated detector in the column 424 of an SEM 420. In the example represented in FIG. 4, a spectrometer 445 and a detector 450 are built into the column 424 of an SEM 420. In addition or as an alternative to the spectrometer-detector combination 440, the spectrometer 445 and the detector 450 may be used in the device 400. The spectrometer-detector combination 440 may include the same type of spectrometer as the spectrometer 445, or a different type.

Figure 5:
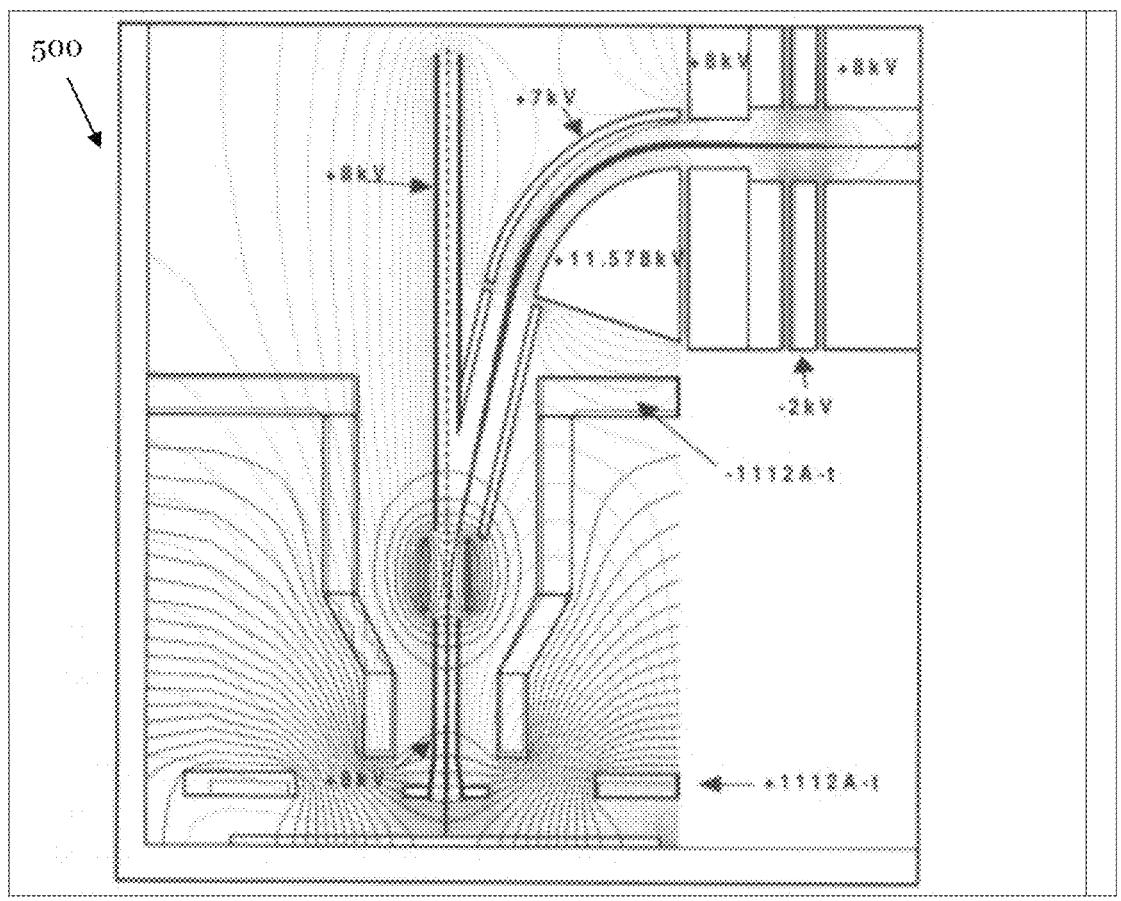
FIG. 5 shows a column of a scanning electron microscope with a multi-channel spectrometer built into the column outside the axis, and presents simulated trajectories of secondary electrons.
Figure 6:
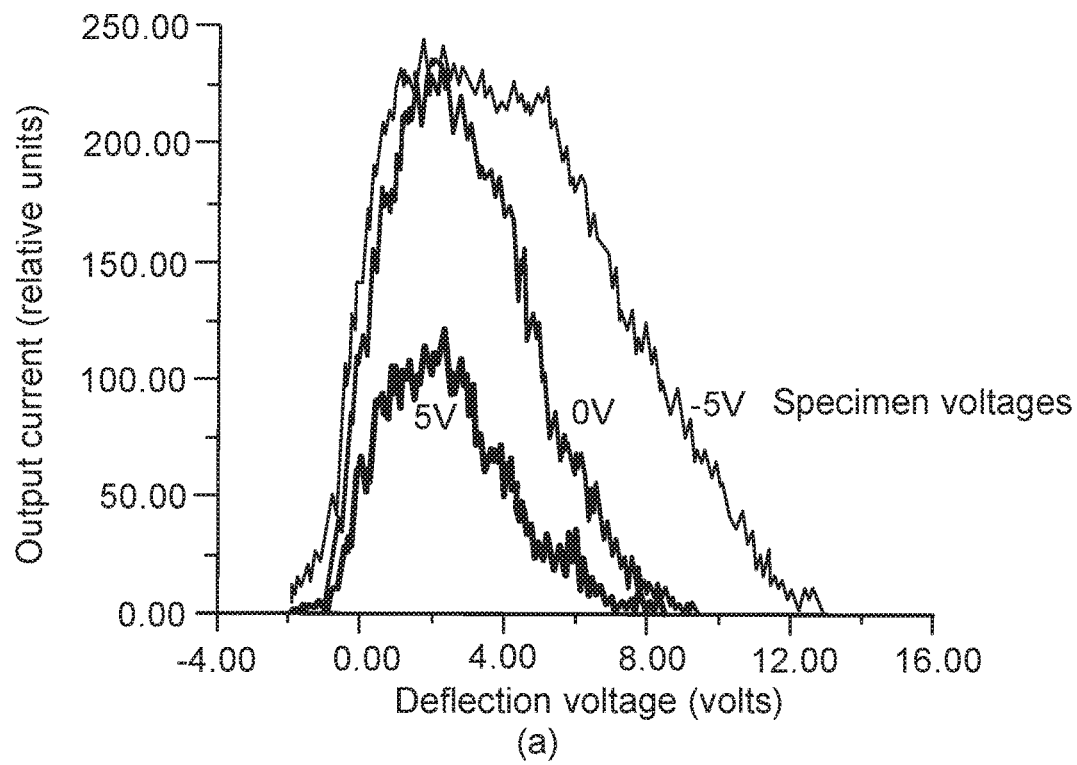
FIG. 6 shows measured spectra of secondary electrons as a function of the surface potential of a specimen.
Figure 6:
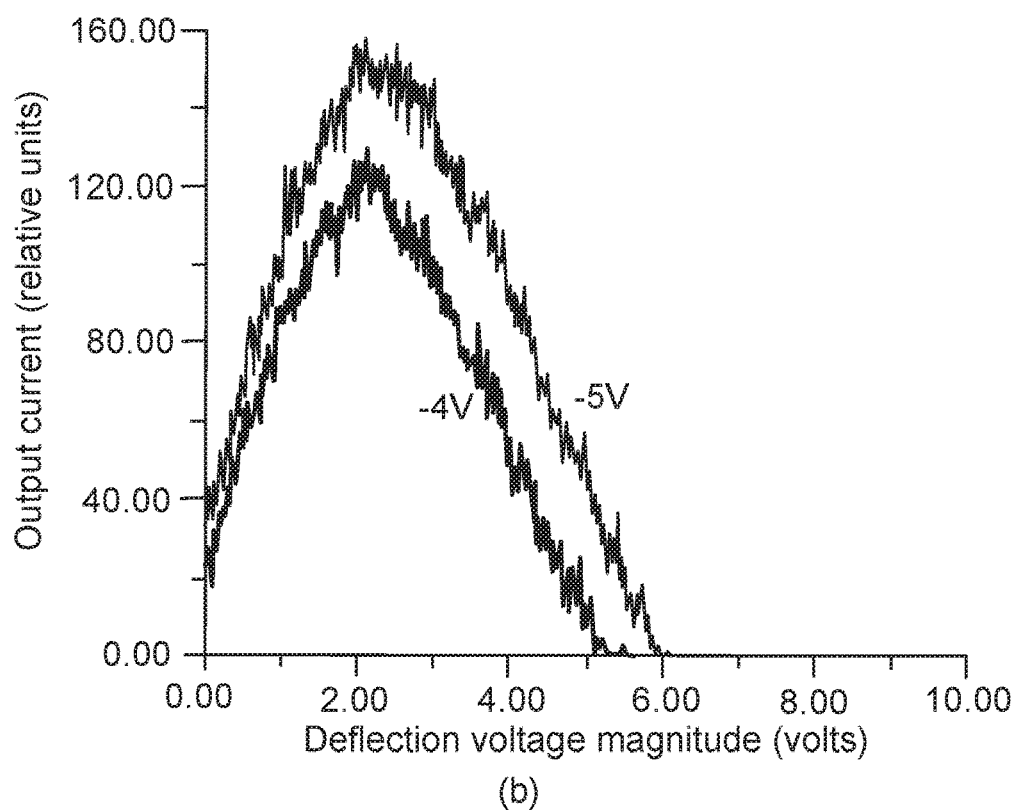

The diagram 500 of FIG. 5 reproduces simulated trajectories of a multi-channel spectrometer that is arranged in the column 424 outside the axis of the electron beam. FIG. 5 and the following FIG. 6 can be taken from the book "Scanning Electron Microscope Optics and Spectrometers" by A. Khursheed. FIG. 6 shows measurements of the spectral energy distribution of secondary electrons as a function of the surface potential 140, 150 of a specimen surface 120, which has been recorded with the aid of an immersion-lens spectrometer built on outside of the column. Both the intensity and the energy-related position of the peak of the secondary electrons 310 change as a function of the surface potential 140, 150 of the specimen surface 120.

Again with reference to FIG. 4, the device 400 may also optionally have a detector 455 for detecting the photons generated by the incident electron beam 428 at the measuring point 435. The detector 455 may for example spectrally resolve the energy spectrum of the generated photons and thereby allow conclusions to be drawn concerning the composition of the surface 120 or layers near the surface of the specimen 110.

In addition, the measuring device 400 may comprise an ion source 460, which provides low-energy ions in the region of the measuring point 435 for the case where the specimen 110 or its surface 120 is electrically insulating or semiconducting and has a negative surface charge 140. With the aid of the ion source 460, a negative charge of the specimen surface 120 can be reduced locally and in a controlled manner.

Should the specimen surface 120 have an undesired distribution of positive surface charges, caused for instance by the handling of the specimen 110, the electron beam 428 can be used to reduce the charge of the specimen surface 120. Furthermore, a plasma discharge may be used to remove surface charges 140, 150 from the specimen surface 120.

In some implementations, the computer system 470 comprises a scanning unit 472, which scans the electron beam 428 over the specimen. The scanning unit 472 controls deflection elements in the column 424 of the SEM 420, which are not represented in FIG. 4. Furthermore, the computer system 470 comprises a setting unit 474, in order to set and control the various parameters of the SEM 420. Parameters that can be set by the setting unit 474 may be for example: the magnification, the focus of the electron beam 428, one or more settings of the stigmator, the beam displacement, the position of the electron source and/or one or more stops (not represented in FIG. 4). Furthermore, the settings of particle detectors connected to the SEM 420 may be modified. In particular, it is advantageous to adapt the energy scale of energy-selective and/or energy-sensitive detectors.

Moreover, the computer system 470 comprises an evaluation unit 476, which can analyze and store the measurement signals of the spectrometer-detector combination 440 and/or of the spectrometer 445 and the detector 450 and also possibly of the detector 455. Since there is at least one energy spectrometer 445 in the device 400, the evaluation unit 476 can determine the spectral distribution of the secondary electrons generated by the electron beam 428. As already mentioned above, the spectral distribution of the secondary electrons depends on the electrical potential distribution of the specimen surface 120.

Figure 7:
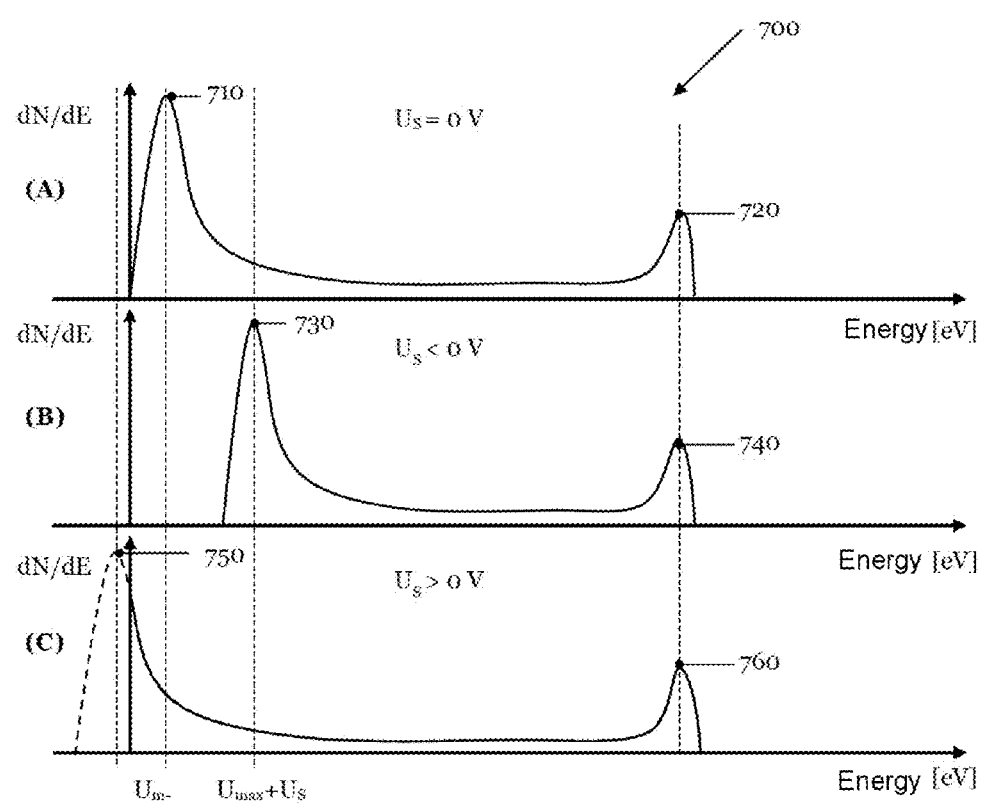
FIG. 7 schematically reproduces spectra, derived on an energy basis, of secondary and back-scattered electrons as a function of the potential of the specimen surface.

The diagram 700 of FIG. 7 schematically illustrates in the various partial diagrams (A), (B) and (C) the variation of the spectral distribution dN(E)/dE of the generated secondary electrons and of the back-scattered electrons in dependence on an electrical potential distribution. The type of the spectrometer 445 used determines the type of signal generated by the detector or detectors 440, 450. This in turn dictates which operations are performed on the primary measurement signal supplied by the detector or detectors 440, 450. If the detector 440, 450 already emits the number of secondary electrons and back-scattered electrons generated per energy interval, i.e. dN(E)/dE, it already provides the spectrum represented in FIG. 7. If the spectrometer 445 is a retarding-field spectrometer, it emits a so-called S curve, the derivative of which produces the spectral distribution represented in FIG. 7. The derivative of the S curve may for example be obtained by the evaluation unit 476 of the computer system 470.

In the upper partial diagram (A), the specimen surface 120 has no surface charges, i.e. $U_S=0V$. In a way similar to the example in FIG. 3, the derivative of the spectral energy distribution has a distinct peak 710 in the region of the secondary electrons. In the vicinity of the kinetic energy of the electrons 428 that are incident on the specimen 110, the spectrum dN(E)/dE has a peak 720 of back-scattered electrons.

The middle partial image (B) represents the electron generation rate derived on the basis of the energy if the specimen surface 120 has a negative charge distribution 150 ($U_S<0V$). The repulsive force of the surface charges 150 makes it possible on the one hand that more secondary electrons can leave the surface and on the other hand that the spectrum of the secondary electrons is displaced towards greater kinetic energy. The peak 710 of the partial image (A), which is characterized by the energy $U_{max}$, becomes in the partial image (B) the displaced peak 730, the peak energy of which is made up of $U_{max}$ and the surface potential Us. Since, due to the repulsive force of the negative surface charge 150, the electron beam 428 that is incident on the specimen 110 loses something of the energy that the back-scattered electrons gain in the region of the maximum energy from the field of electrical potential distribution, the peak 740 remains substantially without any displacement with respect to the peak 720 of the partial image (A).

The lower partial image (C) of the diagram 700 shows in a spectrally resolved manner the variable dN(E)/dE as a function of the energy of the generated electrons, the surface 120 having a positive electrical potential 140 ($U_S>0V$). The attractive force of the positive potential distribution prevents secondary electrons, which are accompanied by a lower kinetic energy than $e \cdot U_S$, from leaving the specimen surface 120, where e is the elementary charge. Depending on the magnitude of the electrical potential, the number of electrons that are available for analysis therefore decreases drastically. As a result, the determination of the peak 750 displaced towards lower energies only takes place indirectly and is consequently only measurable with a large error.

The fact that an electrical field is generated over the specimen surface 120 means that the spectrum of the secondary electrons in the partial image (C) may be displaced towards greater energies by an absolute value defined by the electrical field, so that its peak 750 can be reliably detected. The evaluation unit 476 then numerically makes allowance for the effect of an electrical field. For example, by applying an electrical potential to the grating 430, which is attached to the output of the column 424 of the SEM 420, a setting unit 474 of the computer system 470 can produce a defined static electrical field over the specimen surface 120. With respect to the peak 760, it is similar to the peak 740 as discussed above for the middle partial image (B).

In the schematic partial images (A), (B) and (C) of the diagram 700, it should be noted that the x axis has a non-linear scale. Furthermore, for reasons of clarity, all of the peaks of the partial images are normalized in height. The further structures of the spectrum of the energy distribution of FIG. 3 have been suppressed in the diagram 700 of FIG. 7 for the sake of clarity. These structures are moreover normally only visible in highly resolving spectrometers.

As evident from the discussion so far of the diagram 700, the entire energy spectrum of the generated electrons N(E) does not have to be measured to analyze the displacement of the peak in the spectrum dN(E)/dE. Rather, it is sufficient to investigate the spectrum of the secondary electrons $N(E_{SE})$. This can be performed for example with a simpler spectrometer 445 and/or with a greater spectral resolution. On the other hand, the additional determination of the peak 720, 740, 760 for the maximum energy of back-scattered electrons makes it possible to eliminate zero-point fluctuations of the spectrometer 445 and/or of the spectrometer-detector combination 440 and/or uncertainties of a cause attributable to the extraction field.

The discussion of the diagram 700 shows, in particular in conjunction with the explanations of FIGS. 4 to 6, that the spectrum of the secondary electron distribution is well-suited for detecting an electrical potential distribution 140, 150 of a specimen surface 120. Processes for processing a specimen 110 may bring about an electrical charge in the region of the first threshold and above. The handling of a specimen 110 may bring about a great local electrical charge of the specimen, the sign of which may be positive or negative, so that the absolute value of a local potential of the specimen may reach the region of 1 keV. In principle, an electron beam 175 can charge the specimen in terms of the absolute value to a potential that corresponds to the kinetic energy of the electrons of the electron beam 175. For determining the potential distribution, the potential of a highly positively charged specimen surface 120 is reduced by the scanning of the specimen with an electron beam 428 of an SEM 420 to a voltage in the range of a few volts.

In the energy range in which its electron generation rate is >1—which is typically the case with moderate kinetic energy—an electron beam 428 can itself bring about a positive charge of a specimen surface 120 in the range of a few volts. On the other hand, an electron beam with high-energy electrons may lead to a highly negative charge of the specimen surface, which may be several 100 volts.

Again with reference to FIG. 4, in some implementations, the device 400 has a number of different storage tanks for various gases or precursor gases for processing one or more defects of the surface 120 of the specimen 110. In the device 400 given by way of example, two storage tanks are shown. However, a device 400 may also have more than two storage tanks for processing a specimen 110. The first storage tank 452 stores a precursor gas or a deposition gas, which can be used in cooperation with the electron beam 428 of the SEM 420 for depositing material on the specimen surface 120 and/or a structural element 130. The second storage tank 462 contains an etching gas, with the aid of which the specimen surface 120 and/or a structural element 130 can be etched.

Each storage tank 452, 462 is equipped with its own valve 454 and 464, respectively, to control the amount of gas particles provided per unit of time or the gas flow rate at the location of incidence 435 of the electron beam 428 on the surface 120 of the specimen 110. Furthermore, the two storage tanks 452, 462 have their own gas feeds 456, 466, which end with a nozzle 458, 468 near the point of incidence 435 of the electron beam 428 on the specimen 110. In the device 400 that is represented by way of example in FIG. 4, the valves 454, 464 are built-in in the vicinity of the storage tank. In an alternative embodiment, the valves 454, 464 may be arranged in the vicinity of the corresponding nozzle 458 or 468, respectively (not shown in FIG. 4). Each storage tank 452, 462 may have its own element for the individual temperature setting and control. The temperature setting makes both cooling and heating possible for each gas. In addition, the gas feeds 456, 466 may likewise respectively have their own element for setting and monitoring the temperature at which the gases are provided at the reaction location (likewise not shown in FIG. 4).

The device 400 of FIG. 4 may have a pump system to produce and maintain the required vacuum. The pump system is not shown in FIG. 4 for reasons of clarity. In addition, the device 400 may include a suction extraction device (likewise not represented in FIG. 4). The suction extraction device in combination with a pump or a pump system makes it possible that the fragments or constituents that are produced during the decomposition of a precursor gas and are not required for the local chemical reaction can substantially be extracted from the vacuum chamber 402 of the device 400 at the point of origin. Since the gas constituents that are not required are pumped away locally at the point of incidence of the electron beam 428 on the specimen 110 out of the vacuum chamber 402 of the device 400 before they can be distributed and settle in it, contamination of the vacuum chamber 402 is prevented.

In some implementations, for initiating an etching reaction or a depositing process, a focused electron beam 428 is exclusively used in the device 400 that is given by way of example in FIG. 4.

Figure 8:
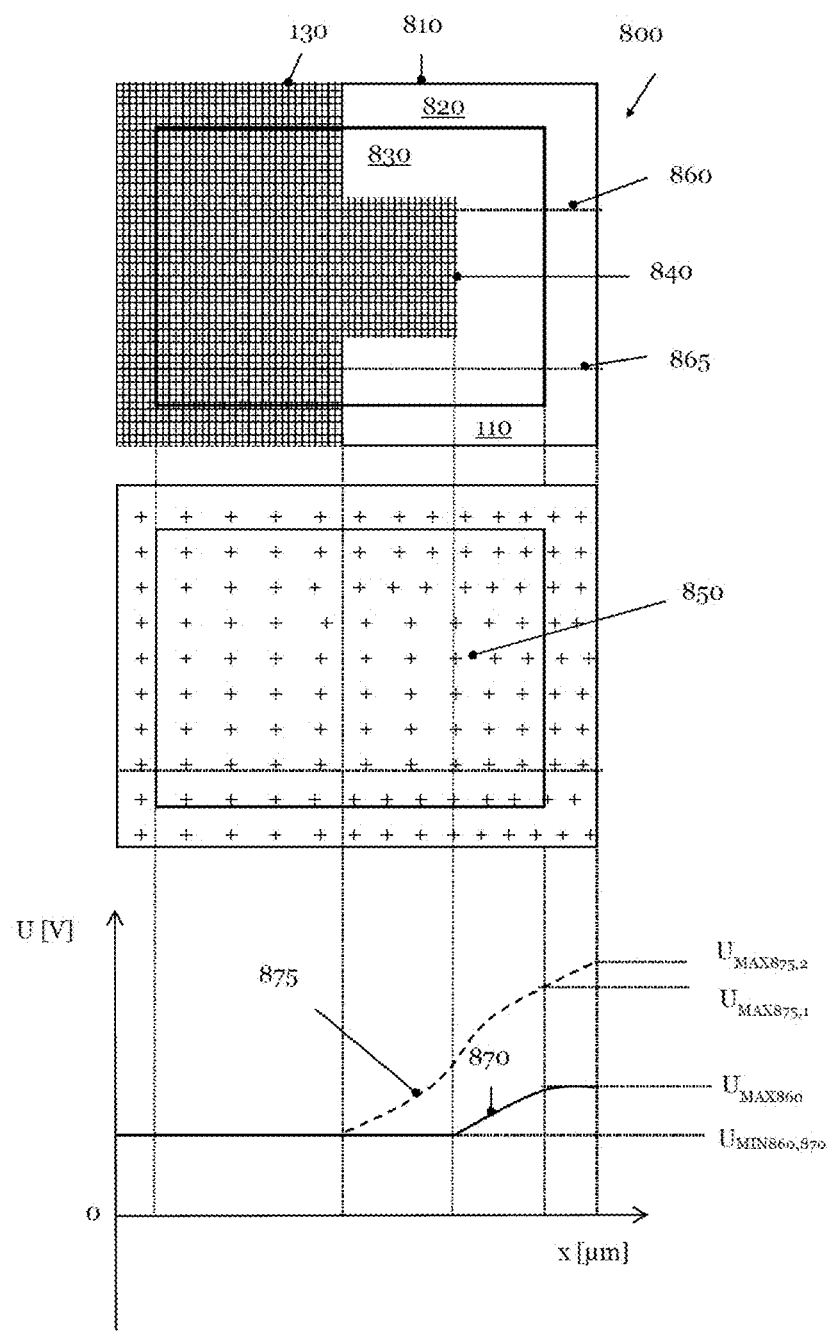
FIG. 8 schematically shows in the upper part of the image a portion of the specimen with a structural element that has a defect, represents in the middle part of the image a plan view of the electrical potential distribution of the portion of the specimen from the upper part of the image, and in the lower part of the image presents two one-dimensional potential distributions along two sectional lines.

On the basis of the diagram 800 of FIG. 8, the processing of the specimen 110 is now described on the basis of an etching process, allowance being made in the etching process for the problems of the potential distribution that is present in the processing region. FIG. 8 shows in the upper partial image a portion 810 of the surface 120 of the specimen 110. The specimen 110 may coincide with the portion of the specimen 110 of FIG. 1. The structural element 130 has a defect 840, which is caused by excess absorber material. This excess material, and consequently the defect 840, are to be removed by an electron-beam-induced etching process. For this purpose, the specimen surface in a second partial region 830 is processed with the aid of an electron beam 428 and an etching gas. The second partial region 830 consequently represents the processing surface for the correction of the defect. In order to ensure that the processing process is not disturbed by electrical potential peaks in the vicinity of the processing surface, the first partial region 820, which contains the second partial region 830, is scanned with an electron beam 428.

The data that are recorded during the scan, i.e. the scanning data, can be used on the one hand to ascertain the position and the size of the defect 840 on the specimen surface 120. As discussed in the context of FIG. 7, the scanning data of the electron beam 428 can be used to ascertain the local distribution of the surface charges over the portion 810 or the first partial region 820. The middle partial image of the diagram 800 schematically shows a plan view of the two-dimensional (2D) distribution of the surface charges 850 or the 2D electrical potential distribution 850.

The lower partial image of the diagram 800 shows the one-dimensional (1D) potential distributions 870 and 875 measured along the sectional lines 860 and 865. In the example represented in FIG. 8, the electrical potential within the structural element 130 and the defect 840 has throughout a low positive numerical value $U_{MIN860,865}$ in the range of several electron volts, which moreover is constant over the structural element 130 and the defect 840. However, this is not a precondition for the application of the methods described here. The density of the surface charges 850 increases towards the border on the right of the first partial region 820 and the second partial region 830. The 1D potential distribution 870 measured along the sectional line 860 has a maximum in the vicinity of the border on the right of the first partial region 820 ($U_{MAX860}$). The 1D electrical potential distribution 870 has a first maximum $U_{MAX875,1}$ at the border on the right of the second partial region 830 and a second, greater maximum $U_{MAX875,2}$ at the border on the right of the first partial region 820. In the example represented in FIG. 8, in the border regions of the first partial region the surface density of the charges 850 does not have any potential peaks that unduly impair an image evaluation of the scanning data in the second partial region 830 and/or a processing of the defect 840 in the second partial region.

An SEM image of the defect 840 and its surroundings can be created from the scanning data of the first partial region 820 and be displayed on the display 480. The SEM image may comprise the first partial region 820 or only the smaller second partial region. Which representation is more advantageous is determined by the type of potential distribution 850 in the first partial region 820. If the ascertained potential distribution 850 does not provide any indication that the border region of the first partial region 820 in the SEM image generated does not contain any significant artefacts, the entire first partial region 820 can be displayed on the display 480. Otherwise, the image display is restricted to the second partial region 830. As already mentioned, image processing typically takes place in the second partial region 830.

On the basis of the electrical potential distribution 850 likewise determined from the scanning data, the scanning data can be corrected, and consequently an SEM image that at least partly eliminates the artefacts of the SEM image caused by the electrical potential distribution 860, 870 can be generated.

Various methods may be used for correcting this scanning data on the basis of the electrical potential distribution 850. On the one hand, it is possible to use as a basis for the correction a 2D mean value of the potential distribution 850 within the second partial region 830. The weighting of the charge distribution in the various regions (i.e. of the structural element 130, of the defect 840 and of the surface 120) within the first partial region 820 and/or the second partial region 830 can be freely selected. It is also possible to form mean values over partial areas of the second partial region 830 and use them for the correction. For example, a mean value for the electrical potential 850 could be formed for 5×5 or 10×10 pixels. Finally, the discussed method allows the determination for each pixel of the first partial region 820 and/or the second partial region 830 of an own potential value, which is used for correcting the scanning data.

The correction values ascertained may be stored in a memory of the computer system 470. The potential distribution 850 ascertained may also be displayed on the display 480 of the computer system 470. On the basis of the displayed potential distribution 850 of the second partial region 830 of the portion 810, it can be established which method is best suited for ascertaining the correction value for the scanning data.

As already stated above, along with the potential distribution 850 from the scanning data that have been recorded during the scanning of the second partial region 830, an SEM image can be generated and displayed in the display 480. This embodiment is preferred, but one scan of the first partial region 820 is sufficient to generate image data and at the same time correction data. In an alternative embodiment, an own scan may be respectively carried out to record on the one hand image data and on the other hand a potential distribution 850 in the first partial region 820. The correction values determined for the potential distribution 850 can be used to correct at least partly the artefacts of the SEM image. The position and size of the defect 840 is determined in the best possible way by the corrected or improved SEM image.

On the basis of the corrected SEM image of the defect 840, the latter can be eliminated by etching with the aid of the electron beam 428 and the provision of an etching gas 462 at the point of incidence 435 of the electron beam. For the etching process, the parameters of the SEM 420 are in this case set such that, in spite of the charged surface 120, in the second partial region 830, in which the electron beam 428 is scanned during the etching process, the electrons are also actually incident on the specimen surface 120 with the intended energy at the position intended for them. If need be, the etching process is interrupted and the potential distribution 850 at the time is again ascertained in the second partial region 830. If the electrical potential distribution 850 has changed significantly, the parameters of the SEM 420 are readjusted, so that an optimized electron beam 428 is available again for the further etching process. The etching operation does not have to be specifically interrupted for determining the potential distribution 850 at the time of the specimen surface 120. Rather, the potential of the surface charges 850 can be determined when the electron beam 428 is scanned over the second partial region 830 without etching gas 462 in order to check the progress in the elimination of the defect 840. In an alternative embodiment, the potential of the surface charges 850 can be ascertained during the ongoing etching process, i.e. without switching off the etching gas 462.

For correcting an SEM image, the evaluation unit 476 contains one or more algorithms that are designed for generating image data from the measurement signals or the scanning data of the spectrometer-detector combination 440 and/or from the spectrometer 445 and the detector 450. Moreover, in a post-processing process the evaluation unit 476 corrects the image data with the correction values for the potential distribution 860, 870 and thus corrects artefacts of the image data that the surface charges 140, 150, 850 cause. For example, with a known distribution of the electrical potential on the specimen surface 120, a trajectory of the electrons can be simulated for each image point and their point of incidence on the specimen surface 120 can be calculated. In this way, a 2D map of displacement vectors that can be used to calculate a corrected SEM image can be created.

Figure 9:
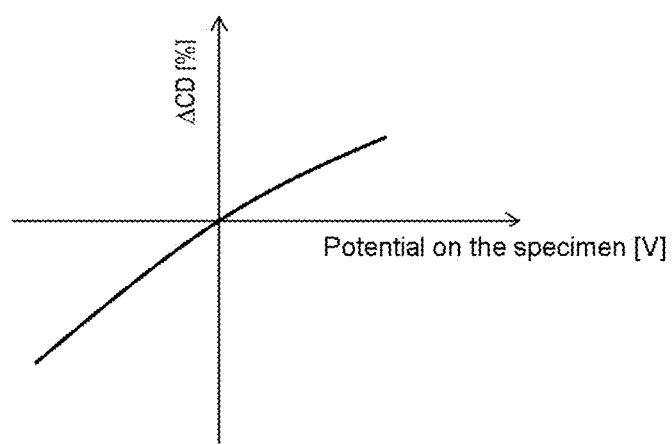
FIG. 9 shows a variation of the critical dimension as a function of the electrical potential on the specimen surface.

FIG. 9 represents an example of a calibration curve that describes the changing of the critical dimension or CD as a function of the electrical potential 140, 150, 850 of the specimen surface 120. With the aid of this curve, CD values can be corrected in a simple way if the potential distribution in the recording of the scanning data is known.

Once again with reference to FIG. 4, the computer system 470 may be integrated in the device 400 or may be formed as a device of its own. The computer system 470 may be configured as hardware, software, firmware or a combination of the above.

Figure 10:
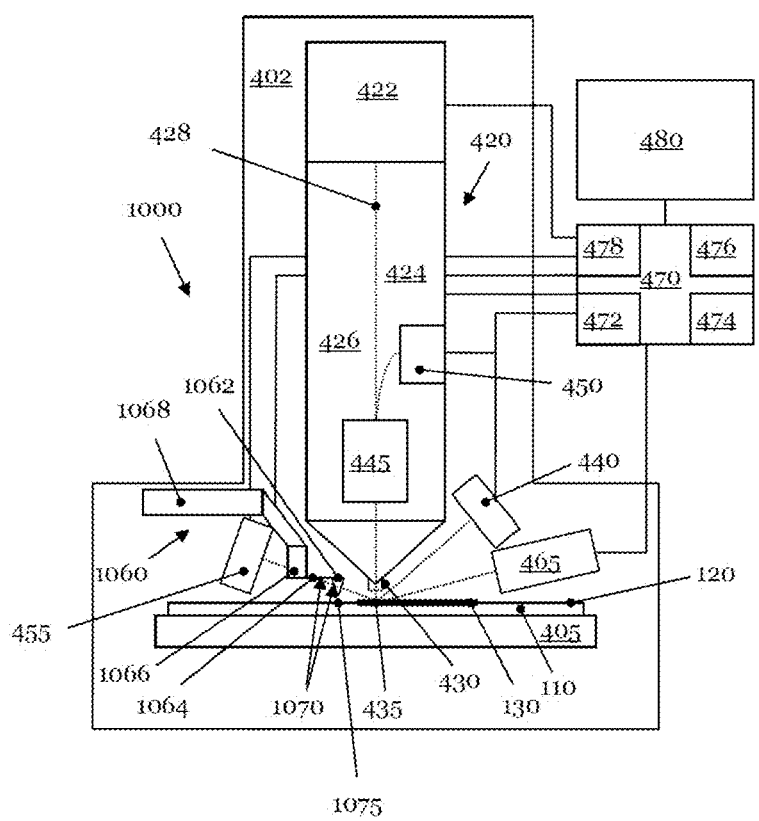
FIG. 10 presents a schematic section through a device that combines a scanning particle microscope and a scanning probe microscope.

The device 1000 of FIG. 10 illustrates a combination of the device 400 of FIG. 4 in which an atomic force microscope (AFM) 1060 is additionally integrated. The AFM 1060 can be seen at this point as being an example of any scanning probe microscope, and merely serves for illustrating the measuring principles. The device 400 has been covered extensively in the description of FIG. 4 above. An AFM 250 is described on the basis of FIG. 2 as an example of a scanning probe microscope.

With the mounting 1068, the AFM 1060 is fastened to the device 1000. The upper end of the piezo actuator 1066 of the AFM 1060 is connected to the mounting 1068. The other end of the piezo actuator 1066 carries the probe 1070 of the AFM 1060. The probe 1070 comprises a lever arm 1064 or cantilever 1064 and a measuring tip 1062, which the cantilever 1064 holds at its free end. The measuring tip 1062 interacts with the specimen 110 or its surface 120 at the measuring point 1075. The AFM 1060 is controlled or monitored by the computer system 470.

The probe of the AFM 1060 is normally isolated in terms of potential from the mounting 1068 by the piezo actuator 1066. Should this not be the case, an electrical insulating layer is inserted between the piezo actuator 1066 and the probe 1070 and/or between the piezo actuator 1066 and the mounting 1068. A feed line is led in the piezo actuator 1066 from the probe 1070 via the mounting 1068 to a voltage source; neither the feed line nor the voltage source are represented in FIG. 10. In this way it is possible to bring the cantilever 1064 and the measuring tip 1062 to a voltage that is defined with respect to earth potential, and consequently to adapt them to the potential distribution 850 of the specimen surface 120.

In order to avoid uncontrolled voltage flashovers 280 between the measuring tip 1062 and the specimen surface 120, the electron beam 428 of the SEM 420 scans a first partial region 820 of the specimen surface 120. As described above, the scanning data thereby obtained are used by the computer system 470 to produce an SEM image and an electrical potential distribution 850. As stated above, a global mean value, i.e. a mean value for the entire second partial region 830, can be formed in various ways from the potential distribution 850. During the scanning of the measuring tip 1062 over the second partial region 830, its potential is adapted to the global mean value or to the respective local mean values. Alternatively, various local mean values can be determined from the potential distribution 850, and the potential of the measuring tip 1062 can be adapted to the just-scanned part of the second partial region 830. Moreover, it is possible to enter each pixel of the 2D potential distribution 850 after a corresponding transformation into the system of coordinates of the AFM scan to reduce a voltage between the local specimen surface 120 and the measuring tip 1062 of the AFM 1060.

If, in terms of the absolute value, the potential distribution 850 has such great numerical values that an adaptation of the potential to these potential values is not possible without the risk of damaging or even destroying the probe 1070, the absolute amount of the potential distribution 850 is reduced for example by irradiating with charged particles. Following that, as stated above, the potential distribution 850 in the second partial region 830 is again measured with the electron beam 428. If the potential distribution then has an absolute value that is harmless for the measuring tip 1062, the second partial region 830 is scanned by the measuring tip 1062 of the AFM 1060, as described above.

Figure 11:
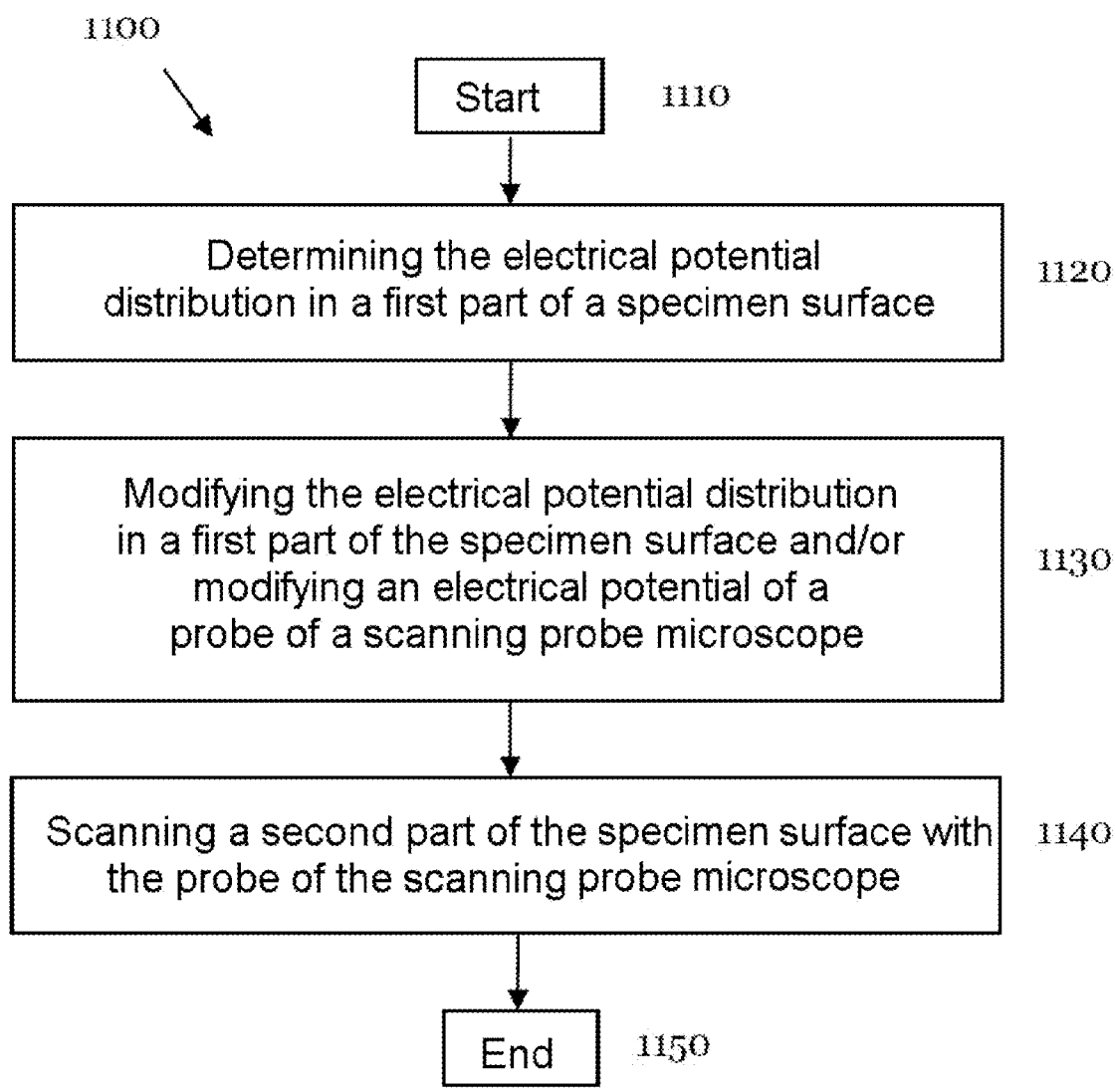
FIG. 11 shows a flow diagram of the steps of a first method for examining a charged specimen surface with a probe of a scanning probe microscope.

The flow diagram 1100 of FIG. 11 represents steps of the method for examining a specimen surface 120 with a probe 1070 of a scanning probe microscope 1060. The method starts at step 1110. In the first step 1120, an electrical potential distribution 850 is determined in a first partial region 830 of a specimen surface 120. In the second step 1130, the determined potential distribution 850 in the first partial region 820 of the specimen surface 120 is modified and/or the electrical potential of the probe 1070 of the scanning probe microscope 1060 is modified. Finally, in the third step 1140, a second partial region 830 of the specimen surface 120 is scanned with the probe 1070 of the scanning probe microscope 1060. The method ends with step 1150.

Figure 12:
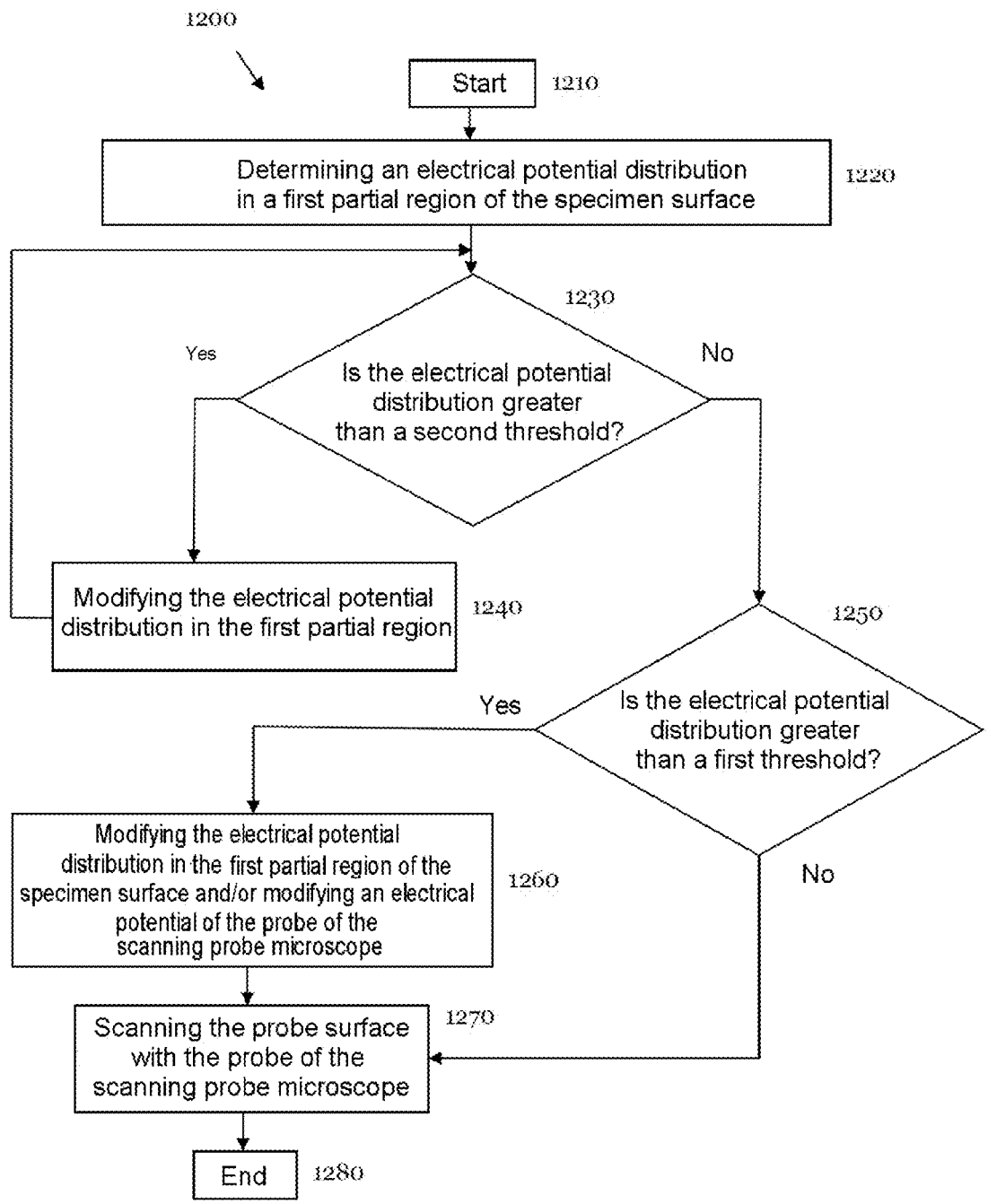
FIG. 12 shows a flow diagram of the first method from FIG. 11 with a greater degree of detail.

The flow diagram 1200 of FIG. 12 illustrates the method for examining a specimen surface 120 with a probe 1070 of a scanning probe microscope 1060 to a greater degree of detail. The method starts at step 1210. During the first step 1220, an electrical potential distribution 850 in a first partial region 830 of a specimen surface 120 is determined. Then, in decision block 1230, it is analyzed whether the potential distribution 850 exceeds a preset second threshold. If this is so, at step 1240 the electrical potential distribution is modified. Following that, in decision block 1230 it is again checked whether the absolute amount of the modified potential distribution is still greater than the second threshold. If the modified potential distribution remains below the second threshold, the method proceeds to decision block 1250, in which it is investigated whether the modified potential distribution is greater than a first threshold value. If this is so, at step 1260 the potential distribution in the first partial region 820 of the specimen surface 120 is modified and/or the electrical potential of the probe 1070 of the scanning probe microscope 1060 is modified. Subsequently, at step 1270, a second partial region 830 of the specimen surface 120 is scanned with the probe 1070 of the scanning probe microscope 1060. If it is established in decision block 1250 that the potential distribution is less than the first threshold value, the method proceeds with step 1270 and scans the second partial region 830 of the specimen surface 120 with the probe 1070 of the scanning probe microscope 1060. The method ends with step 1280.

Figure 13:
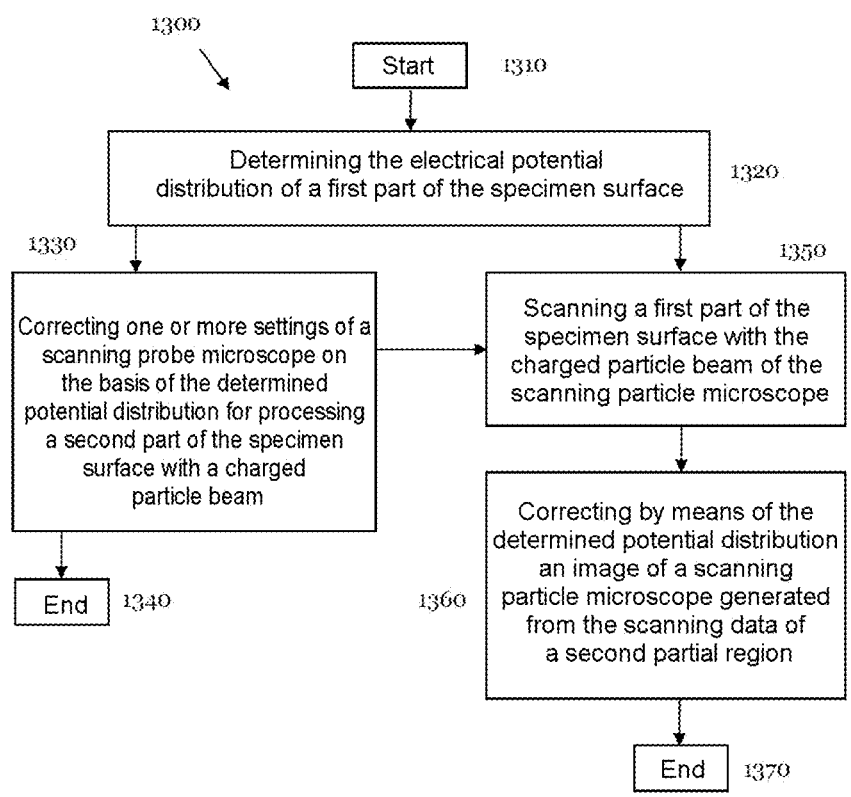
FIG. 13 gives a flow diagram of a second method for examining a charged specimen surface with a charged particle beam of a scanning particle microscope.

Finally, the flow diagram 1300 of FIG. 13 summarizes once again the steps of the described method for examining a specimen surface 120 with a charged particle beam 428 of a scanning particle microscope 420. The method starts at step 1310. In the next step 1320, the determination of an electrical potential distribution 850 of a first partial region 820 of the specimen surface 120 takes place. The method then branches. It may perform the correction of one or more settings of a scanning particle microscope 420 on the basis of the determined potential distribution 850 in step 1330 for processing a second partial region 830 of the specimen surface 120. The method may then end at step 1340. The method may also proceed from step 1330 to step 1350, in that a first partial region 820 of the specimen surface 120 is scanned with the charged particle beam 428 of the scanning particle microscope. In step 1360, the correction of an image of the scanning particle microscope generated from the scanning data of the second partial region 830 then takes place by use of the determined potential distribution 850. The method subsequently ends at step 1370. Moreover, it is possible that, after performing step 1320, the method proceeds to step 1350 without performing step 1330. In this embodiment, the method once again ends at step 1370 after performing step 1360.

In some implementations, the computer system 470 can include one or more processors and one or more computer-readable media (e.g., RAM, ROM, SDRAM, hard disk, optical disk, and flash memory). The one or more processors can perform various calculations described above. The calculations can also be implemented using application-specific integrated circuits (ASICs). The term "computer-readable medium" refers to a medium that participates in providing instructions to a processor for execution, including without limitation, non-volatile media (e.g., optical or magnetic disks), and volatile media (e.g., memory) and transmission media. Transmission media includes, without limitation, coaxial cables, copper wire, fiber optics and free space. The memory can include any type of memory, such as RAM, ROM, SDRAM, and flash memory.

The features described above can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., C, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, e.g., general purpose microprocessors, special purpose microprocessors, digital signal processors, single-core or multi-core processors, of any kind of computer. Generally, a processor will receive instructions and data from a read-only memory or a random access memory or both. The elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM, DVD-ROM, and Blu-ray BD-ROM disks. The processor and the memory can be supplemented by, or incorporated in, ASICs (application-specific integrated circuits).

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results.

What is claimed is:

1. A method for examining a specimen surface with a charged particle beam of a scanning particle microscope, the specimen surface having an electrical potential distribution of an electrostatic charge, the method comprising the steps of:
   determining the electrical potential distribution of the electrostatic charge of at least one first partial local region of the specimen surface; and
   correcting at least one setting of the scanning particle microscope on the basis of a pixel-based determination of the potential distribution of the electrostatic charge to process at least one second partial local region of the specimen surface with the charged particle beam, the at least one first partial local region of the specimen surface containing the at least one second partial local region of the specimen surface.

2. The method according to claim 1, the at least one setting of the scanning particle microscope comprising: altering a magnification, altering a focus, altering a stigmator, altering an acceleration voltage, altering a beam displacement, adjusting a position of a particle source of the scanning particle microscope and/or altering a stop.

3. The method according to claim 1, the processing of the at least one second partial local region of the specimen surface comprising providing at least one of: at least one etching gas for etching material from the at least one second partial local region of the specimen or at least one precursor gas for depositing material in the at least one second partial local region of the specimen surface.

4. The method according to claim 1, wherein the correcting the at least one setting of the scanning particle microscope is performed pixel by pixel.

5. The method according to claim 1, the determination of the electrical potential distribution of the electrostatic charge of the at least one first partial local region of the specimen surface comprising analyzing an energy distribution of secondary electrons of the at least one first partial local region of the specimen surface by use of a spectrometer, the secondary electrons being generated during the scanning of the at least one first partial local region of the specimen surface with a charged particle beam of a scanning particle microscope.

6. The method according to claim 5, the determination of the electrical potential distribution of the electrostatic charge of the at least one first partial local region of the specimen surface comprising determining a displacement of the energy distribution of the secondary electrons.

7. The method according to claim 6, the determination of the displacement of the energy distribution of the secondary electrons taking place with respect to a specimen surface that has substantially no electrical potential.

8. The method according to claim 6, the determination of the displacement of the energy distribution of the secondary electrons comprising applying an electrical field over the at least one first partial local region of the specimen surface.

9. The method according to claim 6, the determination of the electrical potential distribution of the electrostatic charge of the at least one first partial local region of the specimen surface comprising determining a maximum of the energy distribution of back-scattered electrons in the at least one first partial local region of the specimen surface, the back-scattered electrons being generated during the scanning of the at least one first partial local region of the specimen surface.

10. The method according to claim 1, further comprising the step: modifying the electrical potential distribution of the electrostatic charge in the at least one first partial local region of the specimen surface.

11. The method according to claim 10, wherein modifying the electrical potential distribution of the electrostatic charge comprises: irradiating the specimen surface with a charged particle beam, and/or applying a plasma discharge to the at least one first partial local region of the specimen surface.

12. The method according to claim 11, also comprising the step: fixing an irradiation dose of the charged particle beam and/or fixing a time period of the plasma discharge in dependence on the determined electrical potential distribution of the electrostatic charge of the at least one first partial local region.

13. The method of claim 1 in which the specimen comprises at least one of a photomask, a photoresist arranged on a wafer, or a component on a wafer.

14. A device for examining a specimen surface with a charged particle beam of a scanning particle microscope, the specimen surface having an electrical potential distribution of an electrostatic charge, comprising:
  means for determining the electrical potential distribution of the electrostatic charge of at least one first partial local region of the specimen surface; and
  means for correcting at least one setting of the scanning particle microscope on the basis of a pixel-based determination of the potential distribution of the electrostatic charge for processing at least one second partial local region of the specimen surface with the charged particle beam, the at least one first partial local region of the specimen surface containing the at least one second partial local region of the specimen surface.

15. The device according to claim 14, the device being designed to perform:
  determining the electrical potential distribution of the electrostatic charge of at least one first partial region of the specimen surface;
  correcting at least one setting of the scanning particle microscope on the basis of the determined potential distribution of the electrostatic charge for processing at least one second partial local region of the specimen surface with the charged particle beam.

16. The device according to claim 14, the device comprising at least one spectrometer.

17. The device according to claim 14, further comprising means for modifying the electrical potential distribution of the electrostatic charge in at least one first partial local region of the specimen surface.

18. The device according to claim 17, wherein the means for modifying the electrical potential distribution of the electrostatic charge comprises: means for irradiating the specimen surface with a charged particle beam and/or means for applying a plasma discharge to at least the first partial region of the specimen surface.

19. The device of claim 14 in which the specimen comprises at least one of a photomask, a photoresist arranged on a wafer, or a component on a wafer.

* * * * *